United States Patent
Fifield et al.

(12)

(10) Patent No.: US 6,518,827 B1
(45) Date of Patent: Feb. 11, 2003

(54) SENSE AMPLIFIER THRESHOLD COMPENSATION

(75) Inventors: John A. Fifield, Underhill, VT (US); Robert H. Dennard, New Rochelle, NY (US); Russell J. Houghton, Essex Junction, VT (US); Toshiaki Kirihara, Poughkeepsie, NY (US); Wing Luk, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/917,059

(22) Filed: Jul. 27, 2001

(51) Int. Cl.[7] .................................................. H03K 3/01
(52) U.S. Cl. .................................................... 327/534
(58) Field of Search ................... 327/530, 534, 327/535, 536, 537, 538, 540, 541, 543, 545, 546

(56) References Cited

U.S. PATENT DOCUMENTS

| 5,397,934 | A | * | 3/1995 | Merrill et al. | ............... 327/534 |
| 5,883,544 | A | * | 3/1999 | So et al. | ....................... 327/537 |
| 6,147,508 | A | * | 11/2000 | Beck et al. | .................. 326/121 |
| 6,194,931 | B1 | * | 2/2002 | Hwang | ......................... 327/157 |

* cited by examiner

Primary Examiner—My-Trang Nu Ton
(74) Attorney, Agent, or Firm—George Sai-Halasz; Marian Underweiser

(57) ABSTRACT

A method and system are disclosed for adjusting the threshold in MOS devices, in particular for devices used in DRAM sense amplifiers. The effects of process and temperature variations on the threshold are compensated by a back-bias voltage. A comparison of an indicating voltage and a reference voltage is used to generate the back-bias voltage. The direction of back-bias voltage may be either in the backward, or in the forward bias direction.

42 Claims, 4 Drawing Sheets

SENSE AMPLIFIER THRESHOLD COMPENSATION

FIELD OF THE INVENTION

The present invention is related in general to semiconductor integrated circuits, and more particularly to a method and system for adjusting the threshold of devices. Specifically, to use control of the back-bias voltage in semiconductor devices, especially in DRAM sense amplifier circuits, to maintain an aimed-for value of the threshold voltage.

BACKGROUND OF THE INVENTION

Today's integrated circuits include a vast number of transistor devices formed in a semiconductor substrate, or body. In many integrated circuits, such as semiconductor memories or typical microprocessors, the devices formed in the semiconductor substrate are metal oxide semiconductor ("MOS") devices. MOS devices come in two varieties, NMOS and PMOS devices. In most modern integrated circuits one finds both of these devices, and the name CMOS is used to describe such circuits. MOS devices usually have three active terminals; these are the source, the drain, and the gate, the gate being the terminal where an input is typically applied. There is a voltage, called the threshold voltage, or just threshold $V_{th}$, between the source and the gate that is important in device operation. Ideally, if the source to gate voltage exceeds the threshold value, the device conducts, or it is in the so called "on" state. Otherwise the device is in the "off" state and does not conduct. In an actual device, however, the transition between the on and off state is not quite as abrupt. Below the threshold the there is still a current flow between the source and the drain. This current, which flows when gate to source voltage is below the threshold voltage, is known as the leakage current.

The integrated circuits and the devices themselves are in a semiconductor substrate, or body. Consequently the whole device can be biased to certain voltage, or potential in relation to the substrate, or body. This bias is a fourth terminal to the device, and the body to source-terminal voltage is called the well-bias, or back-bias. In the following back-bias, well-bias, body-bias terms will be interchangeably used, since all have the same meaning. In modern CMOS circuits the devices are inside so called wells, not in direct electrical contact with the bulk of the substrate, hence the well-bias name. The back-bias also influences device behavior. An important effect of the back-bias is its influence on the device threshold. The further the back-bias goes in the, or toward, the reverse direction, the larger the threshold becomes. Traditionally, only reverse bias between the well and the source was used, but there is no reason in modern low voltage circuits not to consider a forward biasing back-bias in order to lower the threshold. In general, it is known in the art that the back-bias is a tool with which device thresholds in integrated circuits can be regulated.

As power supplies are reduced below 1-Volt, the question of thresholds is becoming ever more problematic. Setting thresholds at a too low value enhances leakage currents, leading to a variety of detrimental effects. On the other hand, too high a threshold leads to poor device performance. Compounding the difficulties are the unavoidable process and temperature variations, all influencing thresholds. The fabrication process that is used to create the integrated circuits on chips is marvelously precise. In spite of this, since there are many millions of devices on a typical chip, it is impossible to maintain completely uniform device behavior across a given chip, or even more so, between different chips. The power supply voltages being so low, a few hundredths of a volt difference in the thresholds due to process variations, something that in earlier times would not have even been noticed, can cause a major disruption in operation. Also, thresholds are sensitive to temperature. In general thresholds increase with decreasing temperature. Again, the threshold differences caused by temperature changes were manageable in earlier days, but are becoming a source of serious concern in modern circuits.

Some of the most vulnerable circuits to unwanted threshold variations are the DRAM sense amplifiers. The operation of these amplifiers involves a precharging step to a so called "bit-line equalization", $V_{bleq}$, voltage. This $V_{bleq}$ is roughly half of the power supply voltage. This means that the DRAM sense amplifiers are practically as sensitive to threshold variations as if the power supply voltage, already at dangerously low level, were further shrunk by a factor of two.

SUMMARY OF THE INVENTION

This invention deals with solving the issue of threshold variation in modern integrated circuits, and in particular to deal with the problem of DRAM sense amplifiers. Optimizing the $V_{th}$ of DRAM sense amplifier devices over process and temperature becomes very difficult. If thresholds, which during the fabrication process are adjusted by ion implants, are set for high-performance with low $V_{th}$ at low temperature, excessive leakage may occur at high temperature. This invention shows a system, and method thereof, for modulating the back-bias of the devices in order to meet a constant target, or aimed-for $V_{th}$, independently of process and/or temperature variation, and for being able to further fine tune the threshold as the need arises.

Numerous innovations for using back-bias control on MOS devices are available in the prior art that now will be described. Even though these innovations may be suitable for the specific individual purposes which they address, they differ from the present invention.

For example, U.S. Pat. No. 6,048,746 to Burr, incorporated by reference herein, teaches the control of leakage current, but does not teach the present invention.

In a further example, U.S. Pat. No. 6,115,295 to V. Surlekar et al, incorporated by reference herein, teaches the use of back bias to initialize DRAMs, but does not teach the present invention.

In as yet another example. U.S. Pat. No. 6,163,044 to Manning et al, incorporated by reference herein, teaches power reduction through back-biasing with a "pump" circuit, but does not teach the present invention.

The use of back-bias control on MOS devices was also discussed in the recent technical literature. For instance, in "A well-Synchronized Sensing/Equalizing Method for Sub-1.0V Operating Advanced DRAMs" Ooishi et al. IEEE JSSC Vol 29, No. 4 April 1994, the concept of back bias control of DRAM sense amplifiers is discussed. However, there is no method to regulate the sense amplifier $V_t$ to a predetermined target value. Also in "Low Voltage Circuit Design Techniques for Battery Operated and/or Giga-Scale DRAMs" Yamagata et al., IEEE . . . JSCC Vol 30, no. 11, November 1995, control of a sense amplifier's back-bias is discussed. However, no circuit for controlling the sense amplifier $V_t$, independently of process and temperature is shown.

This invention shows a method and circuits to achieve the goal for modulating the back-bias of the devices to meet a constant target, or aimed-for $V_{th}$, independently of process and temperature variation, and for being able to further fine tune the threshold as the need arises.

In the present invention the method comprises a step of generating an indicating voltage. This indicating voltage contains information on the momentary $V_t$ value of devices, and in particular of the devices in DRAM sense amplifiers. The indicating voltage generating circuit has a plurality M, where M is in the order of 10, of MOS devices. These MOS devices in the indicating voltage generating circuit are processed to be identical to the DRAM sense amplifier devices. For the sake of specificity we discuss NMOS devices with the understanding that the invention covers the exact same case for PMOS devices with the semiconductor types of N and P interchanged. The M NMOS devices are connected in parallel to form a $V_t$, indicator. The gates and drains of these indicator NMOSs are connected to a first voltage value. The first voltage can be any value that can easily and reproducibly generated. In one embodiment, this first voltage is conveniently taken to be the bit-line equalization voltage $V_{bleq}$. The sources of these M devices are connected to a current source giving a first current $I_1$ of $M*I@V_{th}$ where $I@V_{th}$ is the specified current at threshold of a single indicating device, assuming that all the indicating devices are of the same width, and are drawing the same target current at threshold. In an alternate embodiment if not all the indicating devices are of the same size, or width, the first current supplied to the sources of the devices is the sum of the target device-currents at threshold. The first current can be supplied by a current mirror, well known in the art, or by other known precision current sources. The voltage appearing on the sources of the indicating devices is $V_i$ an indicating voltage. In this arrangement the indicating devices are conducting at threshold, and the momentary threshold $V_t$ of the device can be measured as the first voltage minus $V_i$, or in a preferred embodiment where the first voltage is $V_{bleq}$, the threshold of the indicating devices is $V_t = V_{bleq} - V_i$. Since the indicating devices are processed to be identical to the DRAM sense amplifier devices, $V_t$ is also the threshold of the DRAM sense amplifier devices.

To ensure that $V_t$ under all conditions is set to a target, or aimed-for threshold $V_{th}$, the two threshold voltages have to be compared, and $V_t$ appropriately adjusted. To accomplish this, the aimed-for threshold voltage $V_{th}$ is subtracted from the first voltage, which in one preferred embodiment is $V_{bleq}$, and this way a regulating voltage, $V_{reg}$ is generated. In a preferred embodiment: $V_{reg} = V_{bleq} - V_{th}$. In one embodiment this $V_{reg}$ can be provided as an input from outside the chip that houses the integrated circuits, in other words $V_{reg}$ is supplied from an off chip source. In an alternate embodiment, $V_{reg}$ can be derived from an on-chip bandgap reference source with high accuracy. Bandgap reference voltage sources are well known in the art of circuit design.

The indicating $V_t$ is compared to the target $V_{th}$, by connecting $V_{reg}$ and $V_i$ to a differential amplifier, a well known circuit in the art of circuit design. For the case NMOS devices one would typically use a P-type differential amplifier, while for the PMOS case one would typically use an N-type differential amplifier. The differential amplifier output is the back-bias voltage, $V_{bb}$. This is applied to the well of all the circuits in need of threshold regulation, in particular it is applied to the DRAM sense amplifier devices. The back-bias voltage, $V_{bb}$, is applied also to the indicating devices themselves. In this matter the voltage $V_i$, which appears on the sources of the indicating devices, is adjusted by automatic action of the negative feedback. This feedback forces $V_i$ to equal $V_{reg}$. Consequently the threshold of devices $V_t$ will equal the aimed-for threshold $V_{th}$. A constant $V_t$ is achieved over the range of the source to body threshold-sensitivity curve.

This method will find and generate a back bias, $V_{bb}$, either in the forward or reverse bias region which will force the device thresholds, in particular the DRAM sense amplifier $V_t$ to the target $V_{th}$ value, independently of process or temperature variations. One has to be aware that some amount of forward back-bias, below the diode voltage of approximately 0.65 V can be used to decrease the $V_t$ without excessive leakage causing undue problems.

The target, or aimed-for, $V_{th}$ may be adjusted at different times for different values for efficient signal margin testing to expose signal weakness. At burn-in it may be advantageous to fix the sense amplifier's back-bias to a known voltage. Tuning for the best value for a target $V_{th}$ can be made by examining the trade offs between sense amplifier overdrive requirements and excessive off-state leakage. Adjustment of the aimed-for threshold value can be made by on/or off-chip configuration registers, laser fuses and/or electronic fuses. The use of electronic fuses enables the $V_{th}$ target to be configured to a desirable level before or after packaging, and before and/or after test, burn-in, or during final use. The aimed-for $V_{th}$ can be tuned for best optimization as a function of operational phases such as temperature, voltage, speed/power requirements, and expected lifetime of the circuits. Within such operational phases the aimed-for $V_{th}$ can be further dynamically tuned for optimization as a function of momentary function, such as an increase of the threshold during an expected longer stand-by, for the sake power reduction. Alternatively, when high performance is needed, for instance in case of DRAM sense-amplifiers during a read-out phase, the threshold can be aggressively lowered for high performance. Of course, one of skill in the art will appreciate that additional reference schemes can be designed to permit sense amplifier $V_{th}$ tracking with source voltage, for example, to achieve a constant overdrive.

In a further embodiment the first current $I_1$ may be set to various values. For instance, not only to an appropriate multiple of the threshold current, but to an appropriate multiple of a current which is higher than the exact threshold value. In such a case both $V_i$ and $V_{reg}$ would be readjusted.

BRIEF DESCRIPTION OF THE DRAWINGS

These and other features of the present invention will become apparent from the accompanying detailed description and drawings.

DETAILED DESCRIPTION OF THE INVENTION

Figure 1:
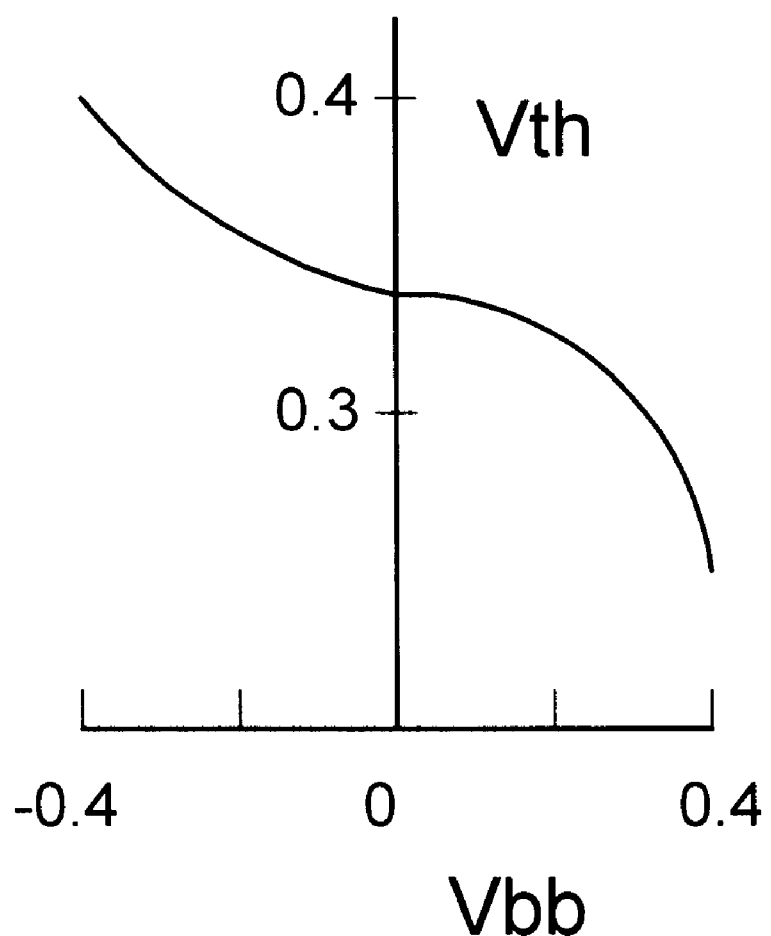
FIG. 1. Schematically shows in a generic sense the relationship between a back-bias voltage and the threshold voltage.

FIG. 1 schematically shows in a generic sense the relationship between a back-bias voltage and the threshold voltage. On the horizontal axis the back-bias voltage $V_{bb}$ is plotted in volts. On the vertical axis the threshold voltage $V_{th}$ is given in volts. The plot shows generic behavior of the threshold. This figure refers the case of an NMOS device, where the source and drain are of an N-type semiconductor, and the well is of P-type. The case for a PMOS device would be the mirror image. In FIG. 1 $V_{bb}$ is voltage on the well relative to the source of the device. A negative $V_{bb}$ means a reverse bias on the source-well junction. The present invention takes into account the various names that have arisen through the years. It is understood that source-well, source-substrate, or source-body names are interchangeably used for the source and the semiconductor bulk that the source in imbedded in. The more negative $V_{bb}$ becomes the higher is the threshold voltage. FIG. 1 shows that one can use a small forward bias on the body, as well. It is a good way to lower the threshold, and if the forward bias does not become excessive, the leakage is manageable. The allowed forward bias depends on the bandgap of the semiconductor, on the temperature, and on the specifics of the device design. The present invention does take advantage of the possibility to forward bias the source-well junction.

Figure 2:
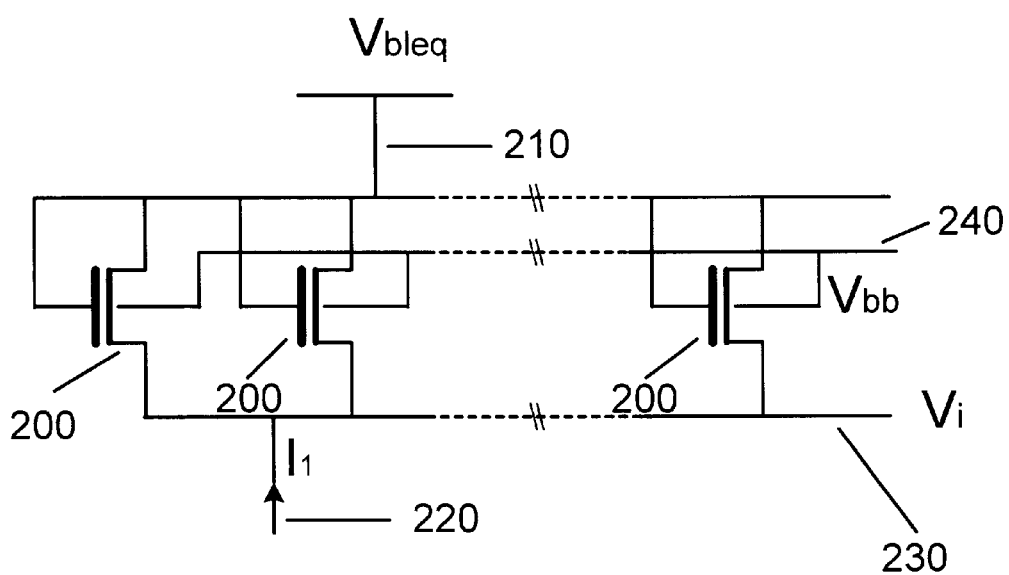
FIG. 2. Shows schematically the indicator circuit.

FIG. 2 shows schematically the indicator circuit. The indicating voltage generating circuit has a plurality of MOS devices, 200. The figure shows only three, but more preferably one would use approximately 10 devices. Again, in the figure the devices are NMOS type, with the understanding that the PMOS case is equivalent with the appropriate semiconductor types interchanged. The devices 200 are shown to be all of equal width, or size. This is a preferred embodiment, but there can be embodiments where the devices would be of different widths. The gates and drains of these indicator devices 200, are all tied to a first voltage value, 210. The first voltage can be any value that can easily and reproducibly generated. In one embodiment this first voltage is conveniently taken to be the bit-line equalization voltage $V_{bleq}$, 210. The sources of these devices are connected together to a current source, which source gives a first current $I_1$, 220. The size of $I_1$ is the total width of the devices times the current per unit width at threshold. If all the devices are identical, and there are M of them, then $I_1 = M*I@V_{th}$ where $I@V_{th}$ is the specified current at the aimed-for threshold of a single indicating device. The first current 220 can be supplied by a current mirror, well known in the art, or by another known precision current source. The voltage appearing on the sources of the indicating devices is $V_i$, 230, the indicating voltage. In this arrangement, due to the size of the first current 220, the indicating devices 200 are conducting what they should at the aimed-for threshold. However precisely because of processing and temperature variations these devices 200 will not be exactly at the prescribed threshold, but at a slightly different value of $V_t$. This $V_t$ of the devices can be measured as the first voltage 210 minus $V_i$, 230, or in a preferred embodiment where the first voltage is $V_{bleq}$, the threshold of the indicating devices is $V_t = V_{bleq} - V_i$. Since the indicating devices are processed to be identical to the DRAM sense amplifier devices, $V_t$ is also the threshold of the DRAM sense amplifier devices. FIG. 2 also shows the fourth terminal of the devices, the well, or back-bias voltage $V_{bb}$, 240, connecting to all of the devices.

Figure 3:
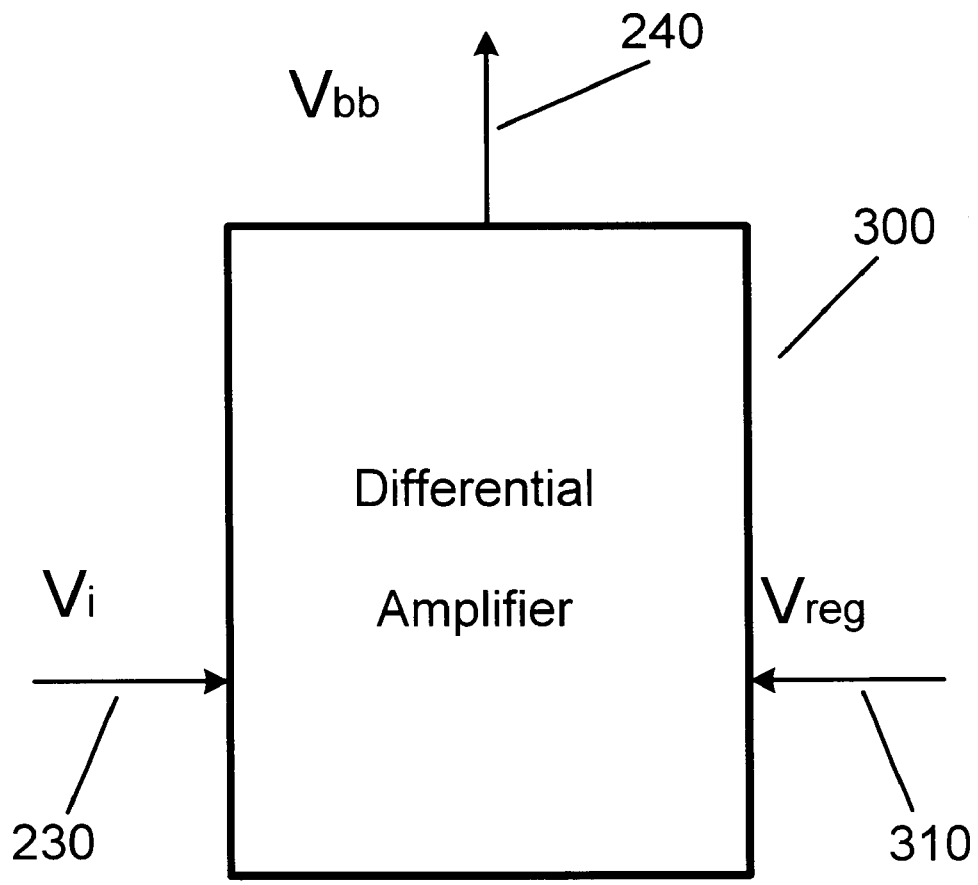
FIG. 3. Shows a block diagram of the back-bias voltage generating circuit.

FIG. 3 shows a block diagram of the back-bias voltage generating circuit. This circuit in a preferred embodiment is a differential amplifier 300. One input to the differential amplifier is $V_i$, 230. The other input is $V_{reg}$ 310. As discussed earlier, $V_{reg}$ is the first voltage minus the aimed-for threshold voltage $V_{th}$. In a preferred embodiment the first voltage is $V_{bleq}$, and this way the regulating voltage, $V_{reg} = V_{bleq} - V_{th}$. In one embodiment this $V_{reg}$ can be provided as an input from outside the chip that houses the integrated circuits, in other words $V_{reg}$ is supplied from an off chip source. In an alternative embodiment $V_{reg}$ can be derived from an on-chip bandgap reference source with high accuracy. Bandgap reference voltage sources are well known in the art of circuit design. The differential amplifier output is the back-bias voltage, $V_{bb}$, 240.

Figure 4:
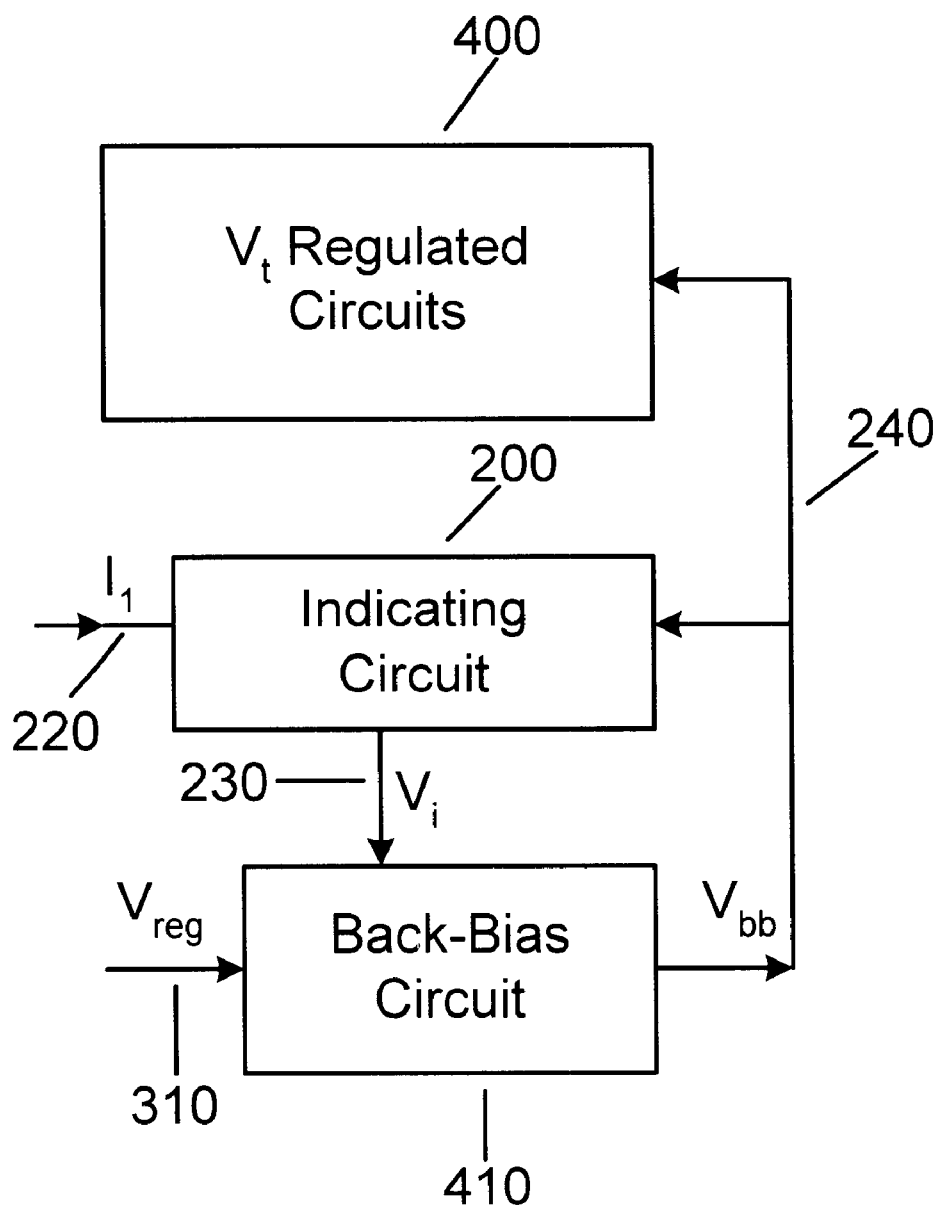
FIG. 4. Shows a block diagram of the threshold regulating method and system.

FIG. 4 shows a block diagram of the threshold regulating method and system. Parts of the method and system were already shown in previous figures, here the connections and interplays between the various components are emphasized. The receivers of the generated back-bias voltage $V_{bb}$ 240 are the circuits that are in need of $V_t$ regulation 400. These are particularly DRAM sense amplifiers, but other logic circuits can benefit from the same scheme. Another particular recipient of $V_{bb}$ is the indicating circuit 200, since it is there that the feedback from the back-bias circuit 410 establishes the equality of the momentary threshold $V_t$ and the aimed-for threshold $V_{th}$. The back-bias circuit 410 is a differential amplifier, a known circuit in the art, but it can have several variations in its details. The indicating circuit 200 receives the first current $I_1$ 220 and generates $V_i$ 230, the indicating voltage that has information on the value of the momentary threshold of the indicating devices $V_i$. The aimed-for threshold $V_{th}$ information is contained in $V_{reg}$ 310. These two input voltages are instrumental in the back-bias circuit to generate $V_{bb}$ 240 the well bias potential. This potential then by feeding back and biasing the source-well junction appropriately, changes the momentary threshold $V_t$ to the aimed-for threshold of $V_{th}$.

In a preferred embodiment the back-bias circuit 410 is a differential amplifier with a typical gain of 60 to 80 db. A loop gain is established between the indicating circuit 200 and the back-bias circuit 410. The high gain of the back-bias circuit 410 assures that $V_i$ 230 and $V_{reg}$ 310 would deviate from each other by at most 100 micro-volts, which value is insignificant in comparison to the threshold values in the range of hundreds of milli-volts.

Many modifications and variations of the present invention are possible in light of the above teachings, and could be apparent for those skilled in the art. The scope of the invention is defined by the appended claims.

We claim:

1. A method for adjusting a threshold in MOS devices in an integrated circuit, wherein the threshold is responsive to a back-bias voltage, comprising the steps of:

connecting in parallel a plurality of indicating MOS devices, wherein the plurality of indicating MOS devices are separate from the MOS devices in the integrated circuit;

connecting gates and drains of the plurality of indicating MOS devices to a first voltage;

passing a first current trough the plurality of indicating MOS devices, wherein on sources of the plurality of indicating MOS devices an indicating voltage is generated, and wherein the indicating voltage contains information on the threshold;

deriving the back-bias voltage from the indicating voltage and from a regulating voltage, wherein the regulating voltage contains information on an aimed-for threshold; and applying the back-bias voltage to the MOS devices in the integrated circuit, whereby the back-bias voltage induces the threshold to match the aimed-for threshold.

2. The method of claim 1, wherein the plurality of indicating MOS devices are all identical with each other.

3. The method of claim 1, wherein the regulating voltage is provided as an input to a chip, wherein the chip houses the integrated circuit.

4. The method of claim 1, wherein the regulating voltage is developed on a chip, wherein the chip houses the integrated circuit.

5. The method of claim 1, wherein the indicating voltage and the regulating voltage constitute inputs to a differential amplifier.

6. The method of claim 5, wherein the regulating voltage is tuned according to operational phases of the integrated circuit.

7. The method of claim 6, wherein the regulating voltage is further tuned according to a momentary function of the integrated circuit.

8. The method of claim 5, wherein the regulating voltage is tuned by the application of fuses.

9. The method of claim 1, wherein in the MOS devices the back-bias voltage biases source-body junctions in a reverse direction.

10. The method of claim 1, wherein in the MOS devices the back-bias voltage biases source-body junctions in a forward direction.

11. The method of claim 1 wherein the integrated circuit is a DRAM sense amplifier.

12. The method of claim 1 further comprising the step of applying the back-bias voltage to the plurality of indicating MOS devices.

13. A method for adjusting a threshold in MOS devices in DRAM sense amplifiers, comprising the steps of:
   connecting in parallel a plurality of indicating MOS devices;
   connecting gates and drains of the plurality of indicating MOS devices to a first voltage;
   passing a first current trough the plurality of indicating MOS devices, wherein on sources of the plurality of indicating MOS devices an indicating voltage is being generated, and wherein the indicating voltage contains information on the threshold;
   applying the indicating voltage and a regulating voltage as inputs to a differential amplifier, wherein the regulating voltage contains information on an aimed-for threshold; and
   applying the differential amplifier output as a back-bias voltage on the MOS devices in DRAM sense amplifiers, and on the plurality of indicating MOS devices, whereby the back-bias voltage induces the threshold to match the aimed-for threshold.

14. The method of claim 13, wherein in the MOS devices the back-bias voltage biases source-body junctions in a reverse direction.

15. The method of claim 13, wherein in the MOS devices the back-bias voltage biases source-body junctions in a forward direction.

16. The method of claim 13, wherein the plurality of indicating MOS devices are all identical with each other.

17. The method of claim 13, wherein the regulating voltage is supplied from an off chip source, wherein the chip houses the DRAM sense amplifiers.

18. The method of claim 13, wherein the regulating voltage is generated on a chip, wherein the chip houses the DRAM sense amplifiers.

19. The method of claim 13, wherein the regulating voltage is tuned according to operational phases of the DRAM sense amplifiers.

20. The method of claim 19, wherein the regulating voltage is further tuned according to a momentary function of the DRAM sense amplifiers.

21. The method of claim 13, wherein the regulating voltage is tuned by the application of fuses.

22. A system for adjusting a threshold in MOS devices in an integrated circuit, wherein the threshold is responsive to a back-bias voltage, comprising:
   a plurality of indicating MOS devices connected in parallel, wherein the plurality of indicating MOS devices are separate from the MOS devices in the integrated circuit;
   a first voltage, wherein the first voltage connects to gates and drains of the plurality of indicating MOS devices;
   a first current, wherein the first current passes trough the plurality of indicating MOS devices, wherein on sources of the plurality of indicating MOS devices an indicating voltage is generated, and wherein the indicating voltage contains information on the threshold;
   a regulating circuit which generates a regulating voltage, wherein the regulating voltage contains information on an aimed-for threshold; and
   a back-bias circuit which generates the back-bias voltage, wherein the back-bias circuit takes the indicating voltage and the regulating voltage as inputs.

23. The method of claim 22, wherein the plurality of indicating MOS devices are all identical with each other.

24. The system of claim 22, wherein the regulating circuit is located off a chip, wherein the chip houses the integrated circuit.

25. The system of claim 22, wherein the regulating circuit is located on a chip, wherein the chip houses the integrated circuit.

26. The system of claim 22, wherein the back-bias circuit is a differential amplifier, wherein the indicating voltage and the regulating voltage constitute inputs to the differential amplifier.

27. The system of claim 26, wherein the regulating voltage is tuned according to operational phases of the integrated circuit.

28. The system of claim 27, wherein the regulating voltage is further tuned according to a momentary function of the integrated circuit.

29. The system of claim 26, wherein the regulating voltage is tuned by the application of fuses.

30. The system of claim 22, wherein in the MOS devices the back-bias voltage biases source-body junctions in a reverse direction.

31. The system of claim 22, wherein in the MOS devices the back-bias voltage biases source-body junctions in a forward direction.

32. The system of claim 22, wherein the integrated circuit is a DRAM sense amplifier.

33. The system of claim 22, wherein the plurality of indicating MOS devices adapted to receive the back-bias voltage.

34. A system for adjusting a threshold in MOS devices in DRAM sense amplifiers, comprising:
   a plurality of indicating MOS devices connected in parallel;
   a first voltage, wherein the first voltage connects to gates and drains of the plurality of indicating MOS devices,
   a first current, wherein the first current passes trough the plurality of indicating MOS devices, whereby on sources of the plurality of indicating MOS devices an indicating voltage is generated; and
   a differential amplifier, the differential amplifier outputting a back-bias voltage, wherein the differential amplifier receiving the indicating voltage and a regulating voltage as inputs, wherein the regulating voltage contains information on an aimed-for threshold.

35. The system of claim 34, wherein in the MOS devices the back-bias voltage biases source-body junctions in a reverse direction.

36. The system of claim 34, wherein in the MOS devices the back-bias voltage biases source-body junctions in a forward direction.

37. The method of claim 34, wherein the plurality of indicating MOS devices are all identical with each other.

38. The system of claim 34, wherein the regulating voltage is generated in a regulating circuit located off a chip, wherein the chip houses the DRAM sense amplifiers.

39. The system of claim 34, wherein the regulating voltage is generated in a regulating circuit located on a chip, wherein the chip houses the DRAM sense amplifiers.

40. The system of claim 34, wherein in the regulating voltage is tuned according to operational phases of the DRAM sense amplifiers.

41. The system of claim 40, wherein in the regulating voltage is further tuned according to a momentary function of the DRAM sense amplifiers.

42. The system of claim 34, wherein the regulating voltage is tuned by the application of fuses.

* * * * *